United States Patent
Lin et al.

(10) Patent No.: US 6,679,316 B1
(45) Date of Patent: Jan. 20, 2004

(54) PASSIVE THERMAL SPREADER AND METHOD

(75) Inventors: Lanchao Lin, Beavercreek, OH (US); John E. Leland, Kettering, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 57 days.

(21) Appl. No.: 09/677,720

(22) Filed: Oct. 2, 2000

(51) Int. Cl.⁷ .............................................. F28D 15/00
(52) U.S. Cl. .............. 165/104.26; 165/170; 165/104.33
(58) Field of Search ........................ 165/104.14, 104.21, 165/104.26, 104.33, 80.3, 80.4, 170

(56) References Cited

U.S. PATENT DOCUMENTS

| | | | |
|---|---|---|---|
| 4,600,053 A | | 7/1986 | Patel et al. |
| 4,630,674 A | | 12/1986 | Skoog |
| 4,747,450 A | * | 5/1988 | Ikegame et al. ........... 165/80.4 |
| 4,749,032 A | | 6/1988 | Rosman et al. |
| 5,642,775 A | * | 7/1997 | Akachi ................... 165/104.21 |
| 5,660,229 A | * | 8/1997 | Lee et al. .............. 165/104.21 |
| 5,697,428 A | * | 12/1997 | Akachi ................... 165/104.21 |
| 6,148,906 A | * | 11/2000 | Li et al. ................ 165/104.26 |
| 6,213,194 B1 | * | 4/2001 | Chrysler et al. ........... 165/80.4 |
| 6,257,320 B1 | * | 7/2001 | Wargo ................... 165/104.33 |

FOREIGN PATENT DOCUMENTS

| | | | | |
|---|---|---|---|---|
| JP | 0153096 | * | 8/1984 | ............ 165/104.21 |
| JP | 0208491 | * | 9/1986 | ............ 165/104.26 |
| JP | 0226595 | * | 9/1988 | ............ 165/104.26 |
| JP | 405052492 | * | 3/1993 | ............ 165/104.26 |
| SU | 0517773 | * | 6/1976 | ............ 165/104.26 |
| SU | 10000724 | * | 2/1983 | ............ 165/104.26 |
| SU | 1145235 | * | 3/1985 | ............ 165/104.26 |

* cited by examiner

Primary Examiner—Christopher Atkinson
(74) Attorney, Agent, or Firm—Richard A. Lambert; Bobby D. Scearce; Thomas L. Kundert

(57) ABSTRACT

A passive thermal spreader and method of fabrication are disclosed. The passive thermal spreader includes a heat transfer plate formed from laminated plates including an internal sealed thermosyphon defined within the interface of the plates. The preferred embodiment of the passive thermal spreader selected to illustrate the invention includes a pair of distinct thermosyphons defined within the interface of three laminated, stacked plates. Each thermosyphon includes a plurality of channels arranged boustrophedonically. Each of the channels includes an elongate straight portion and an end turn portion for connection to the adjacent channel elongate straight portion. Each elongate straight portion includes a channel divider. The channel divider directly contributes to the high performance of the thermal spreader of the present invention by assisting the transport of the working fluid.

11 Claims, 2 Drawing Sheets

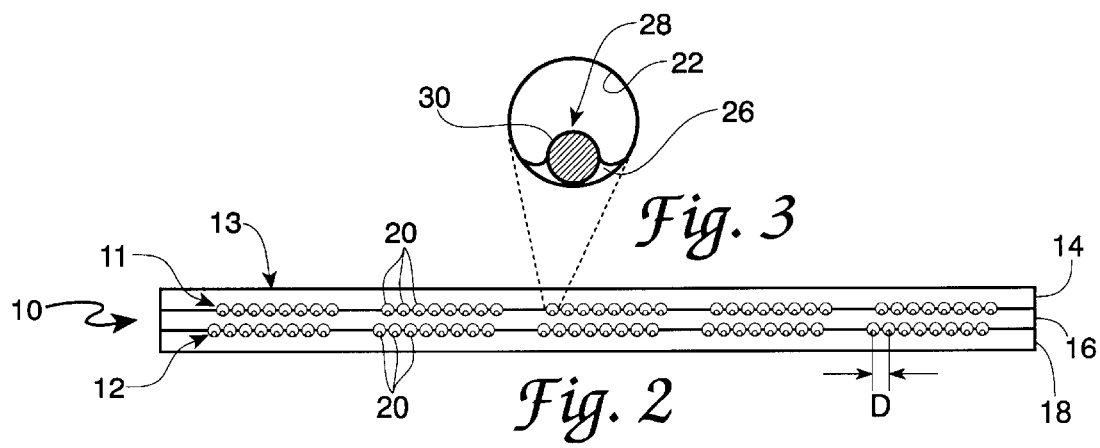
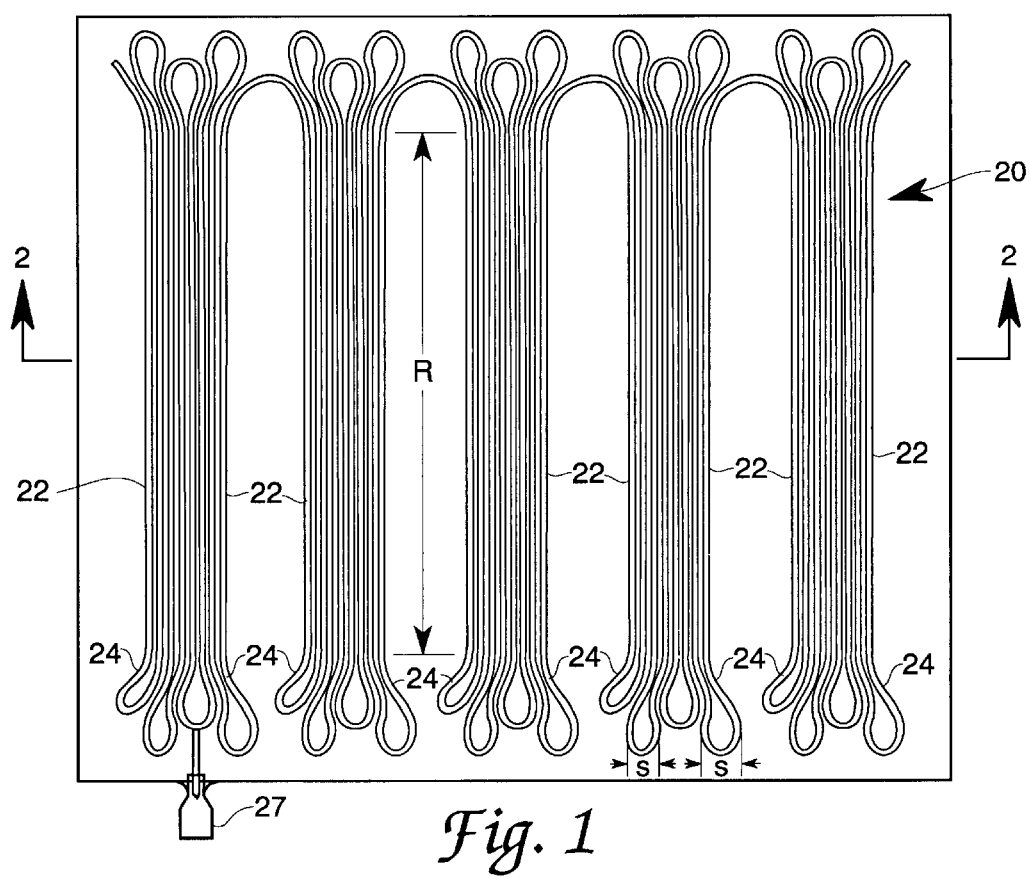

PASSIVE THERMAL SPREADER AND METHOD

RIGHTS OF THE GOVERNMENT

The invention described herein may be manufactured and used by or for the Government of the United States for all governmental purposes without the payment of any royalty.

BACKGROUND OF THE INVENTION

The present invention relates generally to heat transfer elements and more particularly to a passive thermal spreader including at least one oscillating thermosyphon.

Continued growth in the density of electronic devices in general and in aircraft and spacecraft in particular gives rise to the need for innovative, miniature heat transfer elements capable of maintaining high heat flux operation in harsh environments ranging from the micro-gravity (<<1 G) conditions in space to the extremely high acceleration loads encountered by modern military aircraft during evasive maneuvering (up to 10 G).

Conventional heat pipes generally include capillary wicks for inducing transport of the condensed working fluid from the cooler, condenser section, back to the heated, evaporator section. In this way, heat transport through the evaporation and condensation of the working fluid is sustained. Generally, the performance of conventional heat pipes is greatly affected by the gravitational field due to their reliance on wicking to complete working fluid circulation within the heat pipe device. This can be a significant limitation especially when operation in high acceleration loading conditions is desired.

An alternative to the capillary wick heat pipe is found in capillary pumped loop heat transfer devices. While these pumped heat transfer heat devices are capable of operation in a wider range of G forces, they are again disadvantaged by greatly reduced heat exchange capability during operation outside the 1 G window. Moreover, such devices are generally slow to respond to changing heat load conditions and since they must include a reservoir, and a wick structure, they are also not compact. The addition of the reservoir adds complexity, cost and weight. As can be seen, the conventional heat pipe and capillary pumped loop heat transfer devices in use today fail to provide effective high heat flux transfer across the range of operating conditions encountered by aircraft and spacecraft.

A need exists therefore for a heat transfer device capable of passive, yet high heat flux operation throughout a range of operating conditions from much less than 1 G to 10 G or greater (micro to high G). Such a device would be capable of providing high heat flux transfer across a wide range of operating conditions, be self contained and passive in operation.

SUMMARY OF THE INVENTION

Accordingly, it is a primary object of the present invention to provide a passive thermal spreader and method overcoming the limitations and disadvantages of the prior art.

Another object of the present invention is to provide a passive thermal spreader including internal, sealed nonconventional thermosyphons.

Yet another object of the present invention is to provide a passive thermal spreader capable of reliable, high heat flux operation in environments ranging from micro to high G.

Still another object of the present invention is to provide a passive thermal spreader that is self contained, requiring no external work input to maintain operation.

Another object of the present invention is to provide a passive thermal spreader having a heat transfer plate including two independent, sealed thermosyphons.

Still another object of the present invention is to provide a thermal spreader that is small in size, yet capable of removing heat greater than 150 Watts per square centimeter.

Yet another object of the present invention is to provide a passive thermal spreader having three heat transfer plates laminated together and a pair of thermosyphons defined within the interface of each pair of plates, respectively.

Additional objects, advantages and other novel features of the invention will be set forth, in part, in the description that follows and will, in part, become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects and in accordance with the purposes of the present invention as described herein, a passive thermal spreader and method of fabrication includes a heat transfer plate formed from laminated plates including an internal sealed thermosyphon defined within the interface of the plates.

The preferred embodiment of the passive thermal spreader selected to illustrate the invention includes a pair of distinct thermosyphons defined within the interface of three laminated, stacked plates, designated upper, middle and lower, respectively. The first thermosyphon is defined within the interface of the upper and middle plates and the second thermosyphon is defined within the interface of the middle and lower plates. The pair of thermosyphons compliment each other during operation, assuring the desirable high heat flux heat transfer.

Each thermosyphon includes a plurality of channels arranged boustrophedonically, that is, crossing the plate in an alternating left-right then right-left or back and forth manner. Each of the channels includes an elongate straight portion and an end turn portion for connection to the adjacent channel elongate straight portion. A working fluid is incorporated into each of the thermosyphons to effect the heat transfer.

According to an important aspect of the present invention, each elongate straight portion includes a channel divider, which in the preferred embodiment is a thin wire. As will be described in more detail below, the thin wire directly contributes to the high performance of the thermal spreader of the present invention by assisting the transport of the working fluid. Contrary to the standard heat pipe which relies on a complete transfer of working fluid from the condenser to the evaporator through a capillary wick, it has been determined that the thermal spreader of the present invention requires only a portion of the working fluid to be pumped back to the evaporator though the sub channels formed by the thin wire. Thus, in the present invention, only a portion of working fluid is necessary to generate a vapor momentum driving force and to provide the desired high heat flux heat transfer.

More specifically, during operation of the thermal spreader of the present invention, a two phase liquid-vapor flow condition is created characterized by slugs of liquid separated by vapor. Each channel exhibits a pressure that is different from its adjacent channel and the vapor drives the slugs of liquid along the channels based upon the differential pressure of adjacent channels. In the case where no slugs of liquid exist in the evaporator within a given channel, the capillary force created by the thin wire will still pump a fraction of liquid into the evaporator. While the amount of the liquid reaching the evaporator may be very small, the vapor pressure becomes high enough to drive the liquid along the channel until it reaches an adjacent channel, thereby sustaining the desirable two phase flow condition across the thermal spreader. This completely avoids dry out conditions and facilitates the desirable high heat flux heat transfer operation. Moreover, by avoiding the conventional heat pipe requirement of complete liquid transport through the capillary wick, the high heat flux operation is assured across an extraordinarily broad range of G loads from the micro gravity environment encountered in space to the 10 G loads encountered by modern military aircraft when performing evasive maneuvers.

BRIEF DESCRIPTION OF THE DRAWING

The accompanying drawing incorporated in and forming a part of the specification, illustrates several aspects of the present invention and together with the description serves to explain the principles of the invention. In the drawing:

FIG. 1 is a plan cross sectional view of thermal spreader fabricated according to the teachings of the present invention, showing the plurality of boustrophedonic channels forming a thermosyphon;

FIG. 2 is a sectional view taken along section lines 2—2 of FIG. 1;

FIG. 3 is an enlarged sectional view of one elongate channel portion of FIG. 2.

DETAILED DESCRIPTION OF THE INVENTION

Figure 4:
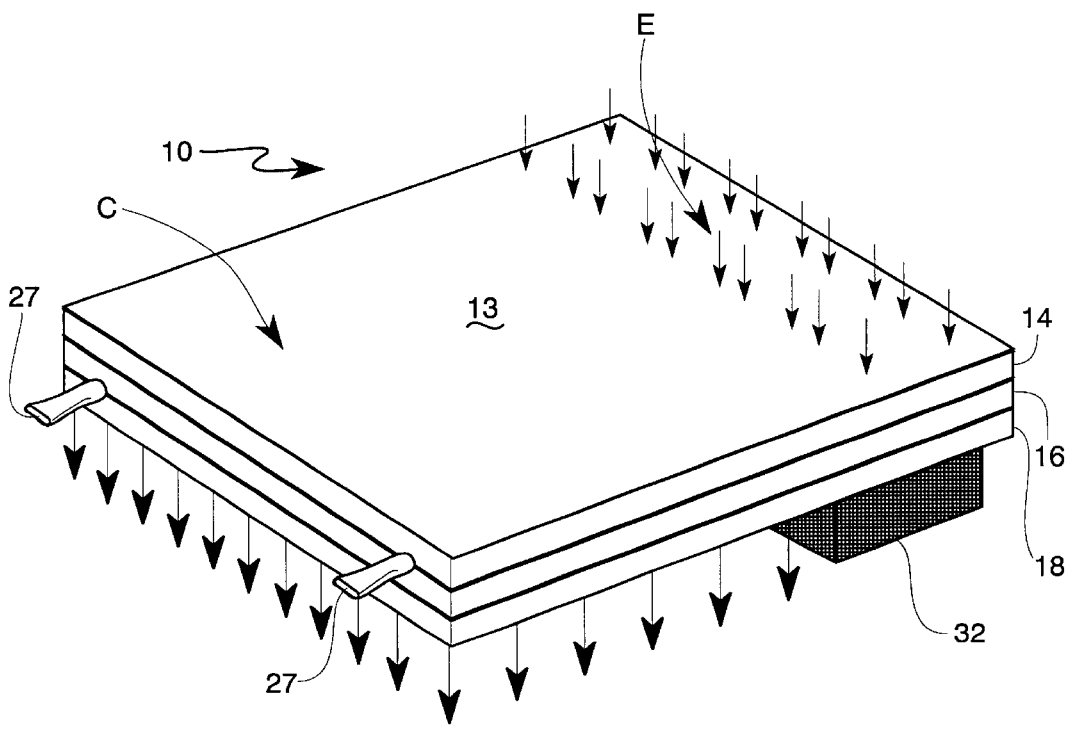
FIG. 4 is a perspective view of the thermal spreader fabricated according to the teachings of the present invention, diagrammatically illustrating the heat flux into and out of the thermal spreader.

Reference is made to the drawing figures showing the passive thermal spreader of the present invention. The thermal spreader includes at least one thermosyphon defined within the interface of a pair of laminated plates. The thermosyphon operates to automatically transfer heat from the heated evaporator region to the cooler condenser region. Advantageously, the passive thermal spreader of the present invention may be formed by the lamination of any number of plates, providing for a plurality of thermosyphons therein.

The preferred embodiment of the passive thermal spreader 10, as shown in FIGS. 2 and 4 includes a heat transfer plate 13 fabricated by laminating an upper plate 14 a middle plate 16 and a lower plate 18 together. As shown in FIG. 2, a pair of distinct thermosyphons 11 and 12 designated first and second, respectively, are defined within the interface of the three plates 14, 16 and 18. Thus, the first thermosyphon 11 is defined within the interface of the upper plate 14 and the middle plate 16 and the second thermosyphon 12 is defined within the interface of the middle plate 16 and the lower plate 18. The plates 14, 16 and 18 can be fabricated from copper or any other suitable heat transferring substance. In the preferred embodiment, the pair of thermosyphons 11 and 12 compliment each other during operation, assuring the desirable high heat flux heat transfer. It should be understood that plates 14, 16 and 18 were designated upper, middle and lower simply for the purpose of description; the passive thermal spreader 10 of the present invention works equally well in any orientation.

As best illustrated in FIG. 1, each thermosyphon 11, 12 includes a plurality of channels 20 arranged boustrophedonically, crossing the plate in an alternating back and forth manner. Each of the channels 20 includes an elongate straight portion 22 and an end turn portion 24 for connection to the adjacent channel. While the dimensions of the channels 20 can be varied to suit a number of applications and working fluids, in the preferred embodiment the inner diameter of the channel elongate straight portion 22 is less than 1.0 mm. And, for optimum operation, it has been determined that the span distance S (FIG. 1) of the end turn portion 24 is greater than the centerline distance D (FIG. 2) of corresponding adjacent channel elongate straight portions 22.

The thermosyphons 11 and 12 are created by selectively machining the respective surfaces of the upper, middle and lower plates 14, 16 and 18. More specifically, one half of each channel 20 is machined into each of the plates 14, 16 and 18 in such a manner that when the plates are laminated together during assembly, preferably using the technology of diffusion bond, the closed thermosyphons 11 and 12 are defined within the interface of the respective plates.

A working fluid 26 is incorporated into each of the thermosyphons 11 and 12 to effect the heat transfer. The working fluid is introduced into the thermosyphons via fill tubes 27 which are then pinched and welded closed thereafter. It has been determined that the thermosyphons 11 and 12 should be filled with working fluid 26 to a level of about 30% to about 50% of the thermosyphon internal volume for optimum operation. Advantageously, the working fluid 26 can be any number of suitable substances including water, acetone, Fluorocarbon FC-72 and Fluorocarbon FC-75. In the preferred embodiment, FC-72 or FC-75 is the working fluid 26 of choice. If water is to be used as the working fluid 26, the channel 20 inside diameter could be increased to about 2 mm. Similarly, if acetone is to be used as the working fluid 26, the channel 20 inside diameter would be slightly less than 2 mm.

According to an important aspect of the present invention, as shown in FIG. 3, each channel elongate straight portion 22 includes a channel divider 28, which, in the preferred embodiment, is a thin wire 30. The thin wire 30 has a diameter of about ⅓ the inside diameter of the corresponding channel elongate straight portion 22. The length of the thin wires 30 corresponds to the length of the region generally designated as R and will vary according to individual thermal spreader dimensions. The channel divider 28 effectively divides the channel elongate portion 22 into adjacent subchannels and as will be described in more detail below, the thin wire 30 directly contributes to the high performance of the thermal spreader 10 of the present invention by assisting the transport of the working fluid 26. Contrary to the standard heat pipes of the prior art which rely on a complete transfer of working liquid from the condenser to the evaporator, it has been determined that the thermal spreader of the present invention requires only a portion of the working fluid to be pumped back to the evaporator in order to provide the desired high heat flux heat transfer.

More specifically, during operation of the passive thermal spreader 10 of the present invention, a two phase liquid-vapor flow condition is created characterized by slugs of liquid (not shown) separated by vapor (not shown). Each channel 20 exhibits a pressure that is different from its adjacent channel. The vapor drives the slugs of liquid along the channels from the warmer evaporator section generally designated E (FIG. 4) to the cooler condenser section generally designated C, based upon this differential pressure. If no slugs of liquid exist in the evaporator section E within a given channel, the capillary forces created by the thin wire 30 on the working fluid 26 will serve to pump a fraction of liquid into the evaporator section E effecting heat transfer. Advantageously and according to an important aspect of the present invention, while the amount of the liquid reaching the evaporator section E may be very small, the vapor pressure nevertheless becomes high enough to drive the liquid along the channel until it reaches an adjacent channel, thereby sustaining the desirable two phase flow condition across the thermal spreader. This completely avoids dry out conditions and facilitates the desirable high heat flux heat transfer operation. Indeed, the passive thermal spreader 10 of the present invention is capable of removing heat greater than 150 Watts per square centimeter.

If desired, thermal insulation 32, shown in FIG. 4, may be attached opposite the evaporator heat flux input side to enhance the heat transfer properties of the thermal spreader 10 of the present invention.

In summary, numerous benefits have been described from utilizing the principles of the present invention. In particular, the passive thermal spreader 10 incorporates at least one thermosyphon 11 having a plurality of boustrophedonically arranged channels. A channel divider 28 is incorporated therein for creating subchannels to facilitate fluid flow within the thermosyphon for providing efficient high heat flux heat transfer. The passive thermal spreader 10 operates entirely passively, requiring no work input to enable operation.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

We claim:

1. A passive thermal spreader, comprising;
   a heat transfer plate including a first plate and a second plate;
   a thermosyphon within said heat transfer plate defined within the interface of said first and second plates, said thermosyphon having a plurality of channels arranged boustrophedonically, each of said channels having an elongate portion and an end turn portion;
   a thin wire within and only making contact with the bottom surface of said channel elongate portions; and,
   a working fluid within said thermosyphon.

2. The passive thermal spreader of claim 1 wherein said working fluid is from the group of water, acetone, FC-72 and FC-75.

3. The passive thermal spreader of claim 1 wherein said thin wires have a diameter of about ⅓ the inside diameter of the channel elongate portion.

4. The passive thermal spreader of claim 1 wherein said upper and lower plates are fabricated from copper.

5. A passive thermal spreader, comprising;
   a heat transfer plate formed by the lamination of an upper plate, a middle plate and a lower plate;
   a first thermosyphon within said heat transfer plate defined within the interface of said upper and middle plates, said first thermosyphon having a plurality of channels arranged boustrophedonically, each of said channels having an elongate portion provided with a thin wire received therein and only making contact with the bottom surface of said channel and an end turn portion;
   a second thermosyphon within said heat transfer plate defined within the interface of said middle and lower plates, said second thermosyphon having a plurality of channels arranged boustrophedonically, each of said channels having an elongate portion provided with a thin wire received therein and only making contact with the bottom surface of said channel and an end turn portion; and,
   each of said first and second thermosyphons having a working fluid received within.

6. The passive thermal spreader of claim 5 wherein said working fluid is from the group of water, acetone, FC-72 and FC-75.

7. The passive thermal spreader of claim 5 wherein said thin wires have a diameter of about ⅓ the inside diameter of the channel elongate portion.

8. The passive thermal spreader of claim 5 wherein said upper, middle and lower plates are fabricated from copper.

9. A passive thermal spreader, comprising;
   a heat transfer plate including a first plate and a second plate;
   a thermosyphon within said heat transfer plate defined within the interface of said first and second plates, said thermosyphon having a plurality of channels arranged boustrophedonically, each of said channels having an elongate portion and an end turn portion;
   each of said channel elongate portions having a centerline;
   each of said channel end turn portions having a span distance, said span distance being greater than the distance between said centerlines of said channel elongate portions;
   a thin wire within and only making contact with the bottom surface of said channel elongate portions, said wire having a diameter about ⅓ of said channel elongate portions; and,
   a working fluid comprising about 30 to about 50 percent of the internal volume of said thermosyphon.

10. The passive thermal spreader of claim 9 wherein said working fluid is from the group of water, acetone, FC-72 and FC-75.

11. The passive thermal spreader of claim 9 wherein said upper and lower plates are fabricated from copper.

* * * * *